United States Patent
Ajram et al.

(10) Patent No.: US 7,692,453 B2
(45) Date of Patent: Apr. 6, 2010

(54) DETECTOR OF DIFFERENTIAL THRESHOLD VOLTAGE

(75) Inventors: Sami Ajram, Marseilles (FR); Franck Strazzieri, Auriol (FR); Florent Garcia, Fuveau (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/743,831

(22) Filed: May 3, 2007

(65) Prior Publication Data

US 2007/0200599 A1    Aug. 30, 2007

Related U.S. Application Data

(62) Division of application No. 10/917,080, filed on Aug. 11, 2004, now Pat. No. 7,227,399.

(51) Int. Cl.
H03K 5/22    (2006.01)
(52) U.S. Cl. ....................................................... 327/65
(58) Field of Classification Search .................... 327/63, 327/65, 66, 70
See application file for complete search history.

(56) References Cited

U.S. PATENT DOCUMENTS

| | | | |
|---|---|---|---|
| 4,647,799 A | 3/1987 | Hsu et al. | |
| 5,045,807 A | 9/1991 | Ishihara et al. | |
| 5,331,210 A | 7/1994 | McCarroll | |
| 5,422,529 A * | 6/1995 | Lee | 327/536 |
| 5,764,086 A | 6/1998 | Nagamatsu et al. | |
| 5,939,904 A | 8/1999 | Fetterman et al. | |
| 6,124,745 A * | 9/2000 | Hilton | 327/276 |
| 6,172,535 B1 * | 1/2001 | Hopkins | 327/66 |
| 6,175,226 B1 | 1/2001 | Clerici et al. | |
| 6,191,835 B1 | 2/2001 | Choi | |
| 6,429,733 B1 * | 8/2002 | Pagliolo et al. | 327/552 |
| 6,437,628 B1 | 8/2002 | Davenport et al. | |
| 6,483,345 B1 | 11/2002 | Whittaker et al. | |
| 6,573,779 B2 * | 6/2003 | Sidiropoulos et al. | 327/345 |

(Continued)

FOREIGN PATENT DOCUMENTS

FR        2868630 B1    6/2006

(Continued)

OTHER PUBLICATIONS

Edwards, C.F., et al., "A High Speed Offset-Compensated Differential Comparator in Floating Body CMOS SOS Technology For Radiation Hard Switched-Capacitor Systems," Proceedings 1997 IEEE International Conference, Oct. 6-9, 1997, New York, pp. 160-161.

(Continued)

*Primary Examiner*—Quan Tra
(74) *Attorney, Agent, or Firm*—Schwegman, Lundberg & Woessner, P.A.

(57) ABSTRACT

A differential threshold voltage level detection circuit receives a differential voltage pair as an input, applying each component of the differential pair to an individual voltage shifting circuit. Each voltage shifting circuit is configured with a regulated current producing a shifted and a non-shifted version in-phase. For a shifted set of output differential voltages, the shift magnitude is proportional to the current entering a shifting circuit and is configured to be less than a peak-to-peak magnitude of the differential voltage to be detected. A current mirror within the detector contains a current reference configured to produce a current to be passed through a voltage generator. The current magnitude is sufficient to generate a regulated voltage output to the two current regulating devices that supply the voltage shifting circuits. An overlap detector receiving both differential voltage pairs produces a signal indicating an input is at a detection threshold.

22 Claims, 7 Drawing Sheets

U.S. PATENT DOCUMENTS

| | | | |
|---|---|---|---|
| 6,642,746 B2 * | 11/2003 | Donnelly et al. ............ | 327/3 |
| 6,897,492 B2 | 5/2005 | Ochi | |
| 6,985,021 B1 | 1/2006 | Zaliznyak et al. | |
| 7,053,670 B2 * | 5/2006 | Muto et al. .............. | 327/65 |
| 2002/0070767 A1 | 6/2002 | Therisod | |

FOREIGN PATENT DOCUMENTS

| | | | |
|---|---|---|---|
| FR | 2868629 B1 | 8/2006 | |
| JP | 60033734 A | 2/1985 | |
| JP | 360033734A B1 | 2/1985 | |

OTHER PUBLICATIONS

Dowlatabadi, A.B., et al., A Generic Voltage Comparator Analog Cell Produced in Standard Digital CMOS Technologies, Circuits and Systems, 1996, IEEE 39th Midwest Symposium, Ames, IA, Aug. 18-21, 1996, pp. 35-38.

Dowlatabadi, Ahmad Baghai, et al., "A Generic Voltage Comparator Analog Cell Produced in Standard Digital CMOS Technologies", *School of Electrical and Computer Engineering, Georgia Institute of Technology, Atlanta, GA 30332-0250, 1997 IEEE*, (0-7803-3636-4/97), (1997), 35-37.

* cited by examiner

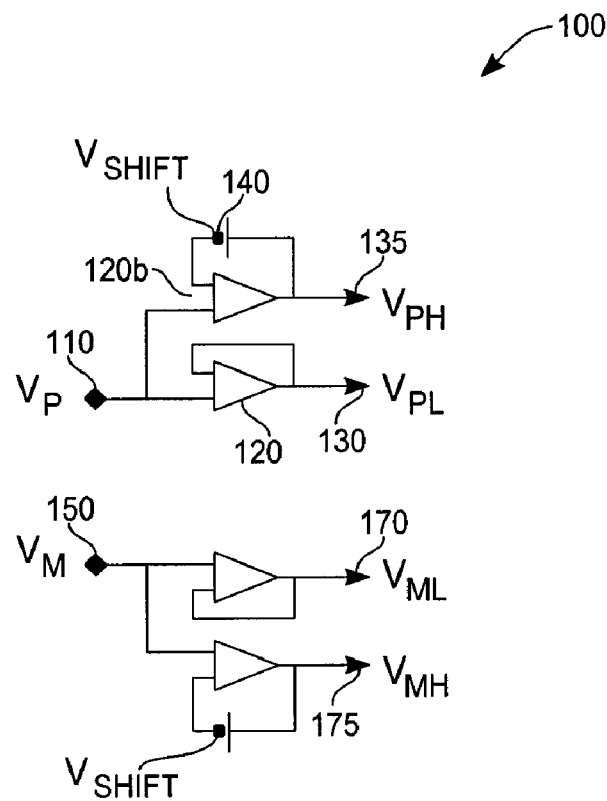
Fig._1
*(Prior Art)*
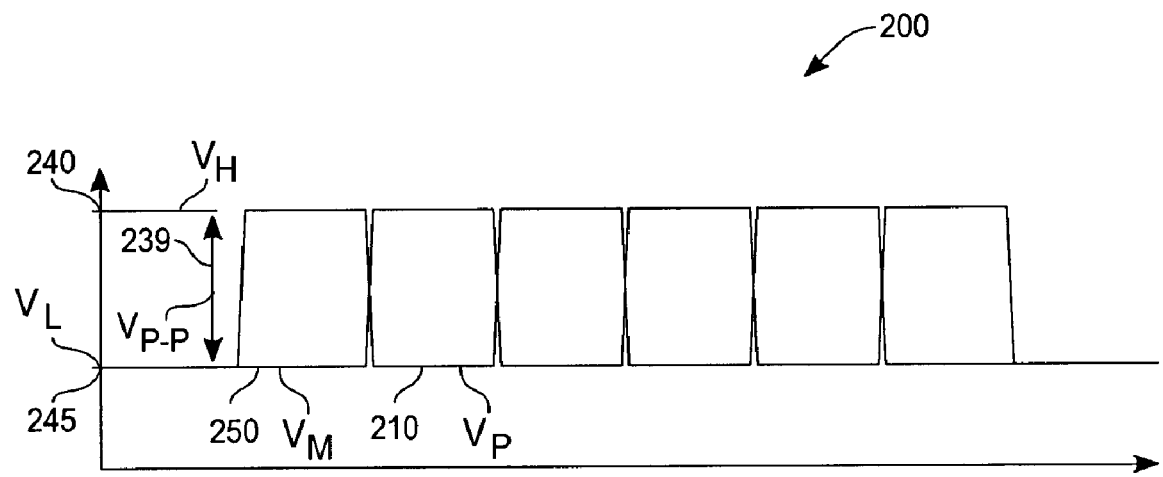
Fig._2

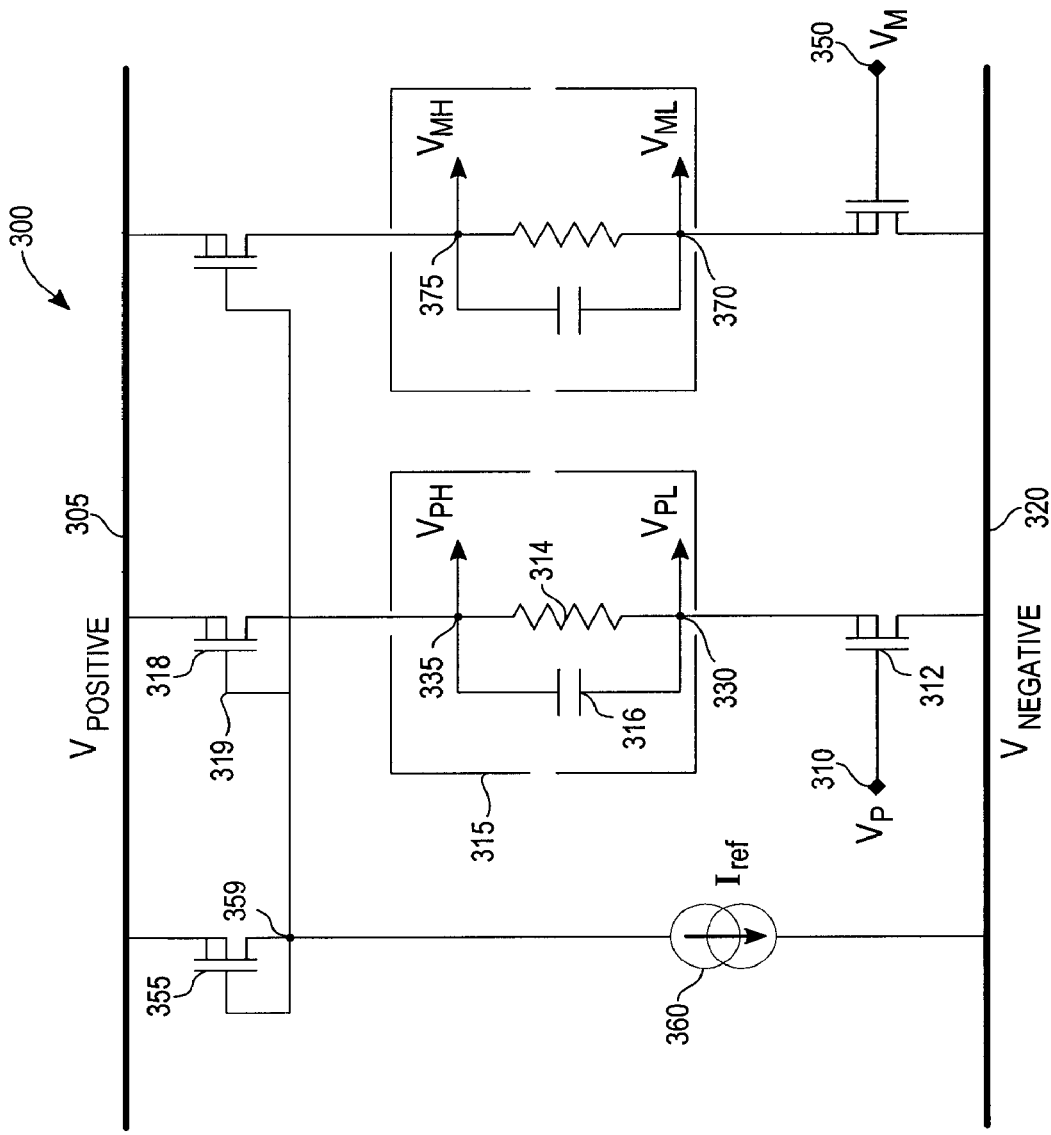
Fig._3

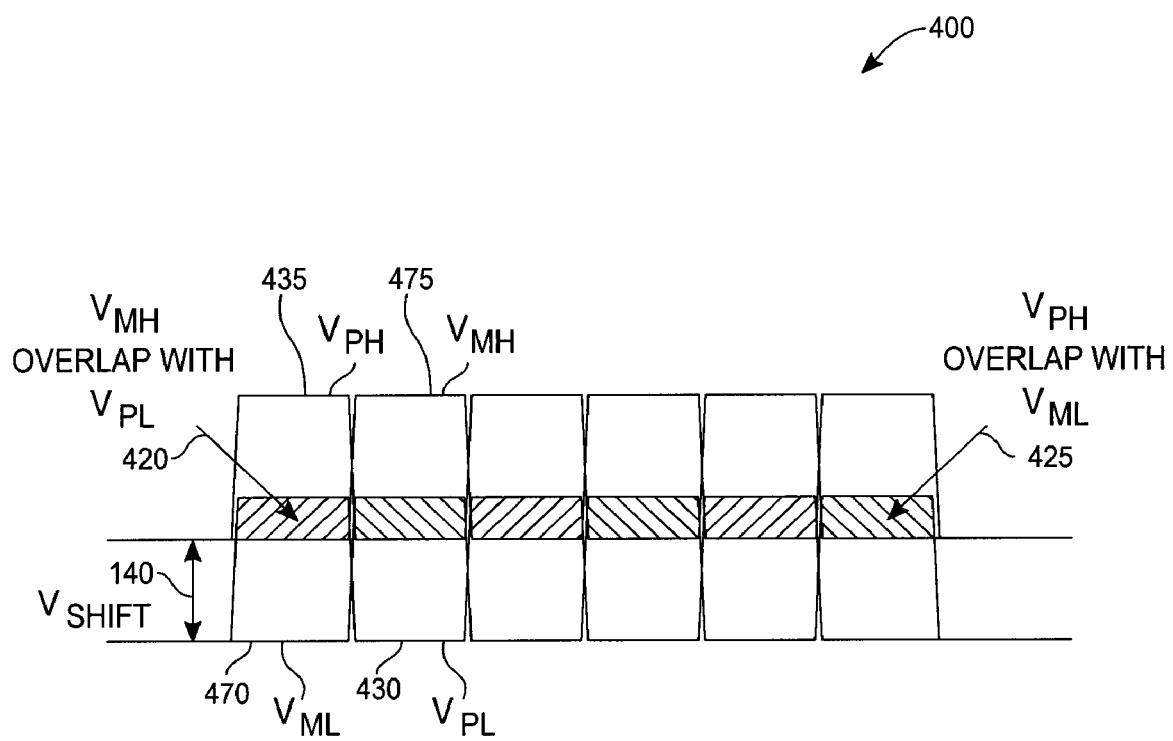
Fig._4

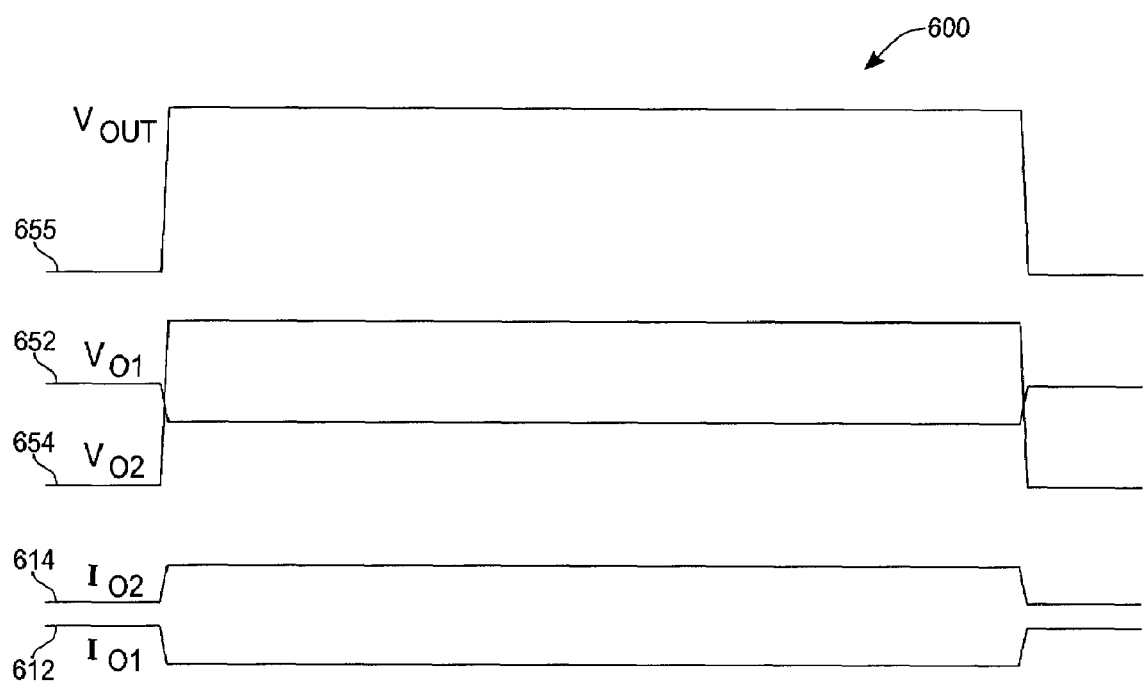
Fig._6

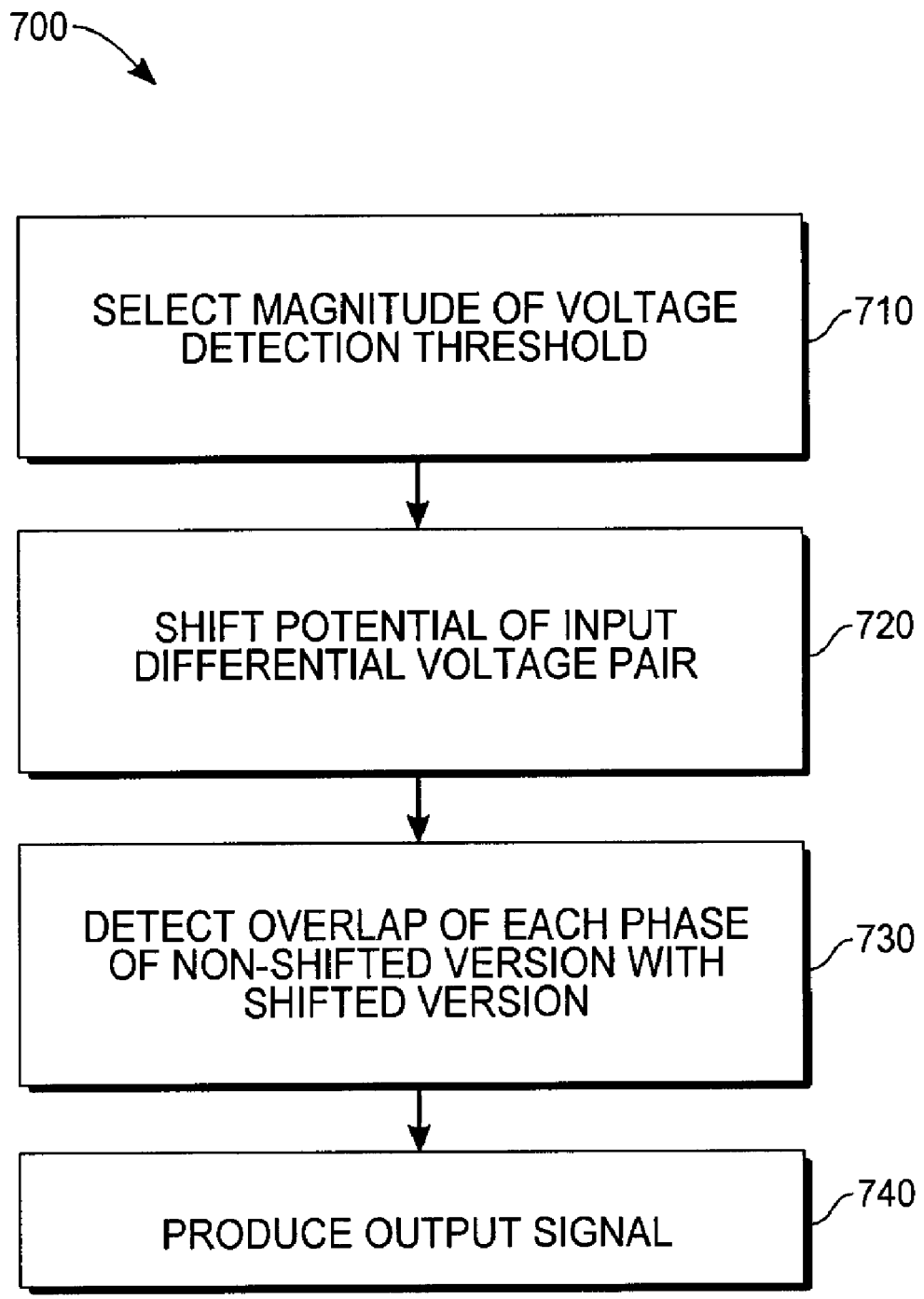
Fig._7

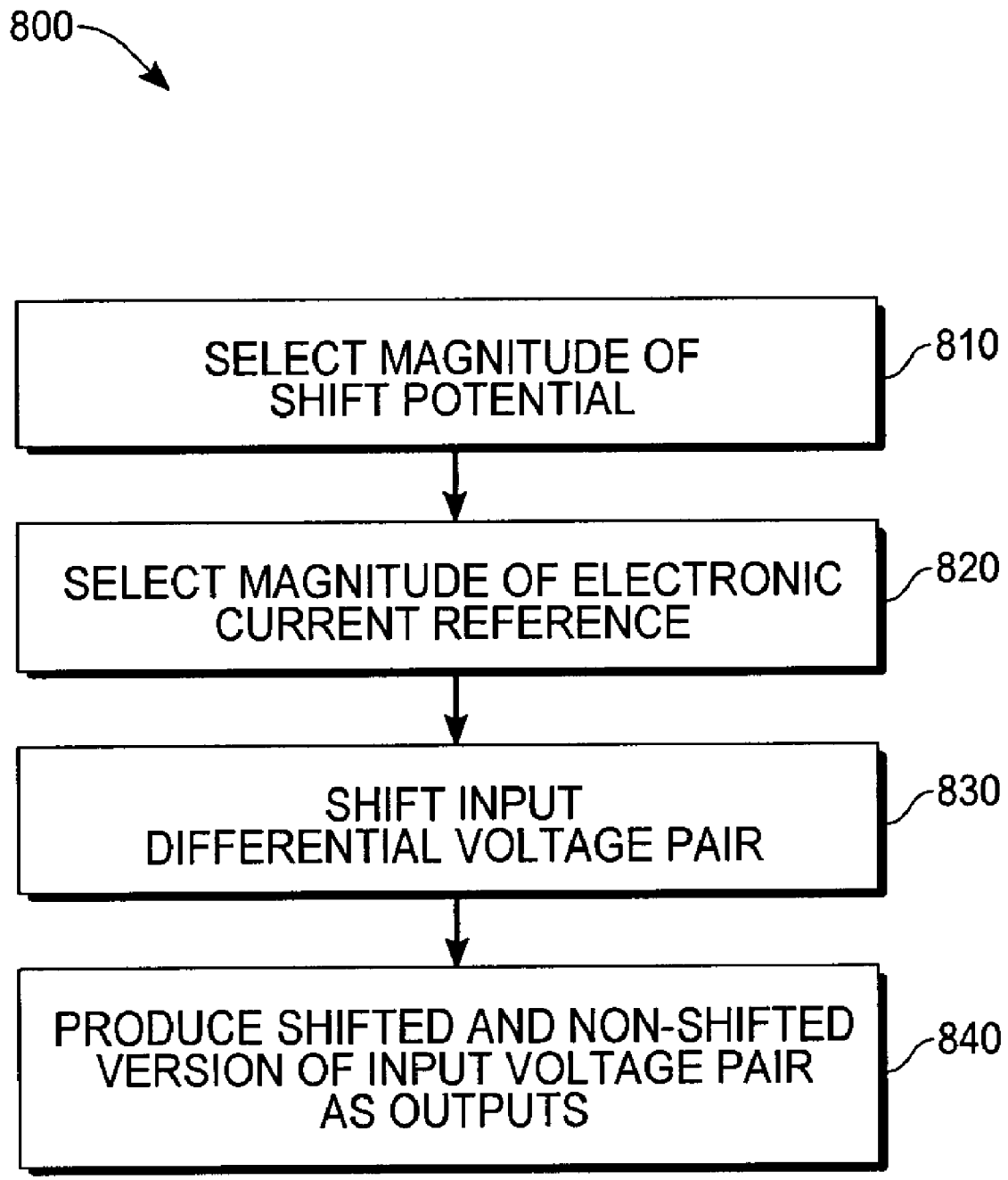
Fig. _ 8

DETECTOR OF DIFFERENTIAL THRESHOLD VOLTAGE

CROSS-REFERENCE TO RELATED APPLICATION

This is a divisional application of pending U.S. patent application Ser. No. 10/917,080 filed Aug. 11, 2004.

TECHNICAL FIELD

The present invention relates to the field of differential voltage level detection. More specifically, the present invention relates to the detection of high-speed differential signals based on sensing their overlap with a reference threshold level.

BACKGROUND ART

Differential signals are used for inexpensive, high speed, low power, and noise immune communication. Differential signal pairs have complementary voltage components transitioning in potential in opposite directions. This complementary transitioning allows communication with signals at lower peak-to-peak voltages since receivers can have input thresholds more optimally controlled than single ended detectors. The lower voltage swings mean lower power requirements.

Differential threshold detection typically involves a detector circuit taking, as input, a differential input signal component and producing a voltage or current quantity in response to changes in that input signal. The detector duplicates the generation of an electrical response for the opposite (complementary) component of the input signal and combines the two components in an interconnecting network to provide a complete detection means. The detector can take advantage of the two voltage or current quantities, operating complementarily, to heighten sensitivity and require less peak-to-peak magnitude at the inputs for detection. Additionally, most differential detection circuits do not respond significantly to identical changes in the input pairs that may be induced by noise, process, or temperature influences. Ideally, when both signals have a similar positive or negative constituent, the differential detector tracks the similar constituents equally and does not add a response due to the similar constituents to the output difference signal. This effect is known as a common mode rejection capability.

In other differential detection techniques, current mirrors bias long channel transistor pairs in saturation to provide currents to process. Differential signal components applied to complementary transistors provide current steering of these quantities. In the limit, as the input voltage components range in opposition, one side hoards all the current and the other branch is open and non-conductive. In this way, a single signal transition is detected. Through symmetry of the circuit, complementary signal transitions are detected. Maximum amplifier gain is achieved when both devices are in saturation for as much of the input signal transition as possible. This maximizes power consumption. A more desirable technique would accomplish a similar detection result with less power.

Attempts to improve differential signal detectors can be found. For example, U.S. Pat. No. 5,939,904 to Fetterman et al. describes a regulating device for controlling common-mode voltages in a differential buffer. A common-mode output voltage is driven to a selected value by supplying two currents, of opposite polarities, to an output of the differential buffer. A resulting output voltage is sensed and a second current adjusted to give a desired common-mode output voltage. U.S. Pat. No. 6,175,226 to Clerici et al. describes a fully differential amplifier with a current mirror providing regulation for an output voltage of the amplifier. The output voltage of the differential amplifier remains fixed at a value of a reference voltage applied to the regulating branch of the current mirror. U.S. Patent Application Publication No. 2002/0070767 to Therisod describes a high frequency detector circuit, which includes a differential amplifier with a biasing network across the differential inputs. A biasing network midpoint is connected to an output transistor. The output transistor regulates when the differential amplifier turns on, based on the input differential voltage signal.

However, these references all suffer disadvantages in at least one of the following areas: allow for the application of a reference current to generate a shift in voltage of a differential signaling structure enabling setting precisely calibrated levels of detection; create paired high-level and low-level signal sets, mutually calibrated from a single source, suitable for direct application to a voltage overlap detector with a limited number of devices to minimize circuitry; and allow for the generation of shifted and non-shifted voltage pairs with precision in reduced voltage supply and limited bandwidth environments encountered in present integrated circuit chip technologies.

With respect to FIG. 1, a prior art front-end voltage level shifter 100 is shown. A positive component of a differential voltage pair is input to a first differential input 110 ($V_P$). The first differential input 110 connects to two operational amplifiers. A first operational amplifier 120a provides a phase shift of the input signal at the positive differential—low terminal 130 ($V_{PL}$). A second operational amplifier 120b is connected with a first shifting voltage source 140. The second operational amplifier 120b produces an output at a positive differential—high terminal 135 ($V_{PH}$) that is shifted by the magnitude of the first shifting voltage source 140 and that is in phase with the output at the positive differential—low terminal 130.

In further regard to FIG. 1, a negative component of a complementary differential voltage pair is connected to a negative differential input 150 ($V_M$). At the negative differential input 150, circuitry is connected that is symmetrical to that described, supra, in the processing of the positive component. Processing of the negative component occurs similarly, but shifted in phase by 180° compared to the description of the positive component. Complementary differential voltages are produced at a negative differential—low terminal 170 ($V_{ML}$) and a negative differential—high terminal 175 ($V_{MH}$)

Relative to FIG. 2, a complementary differential voltage pair is composed of a positive component 210 and an opposite or negative component 250. Both components may vary in potential within a peak-to-peak differential voltage 239 ($V_{P-P}$) range. The peak-to-peak magnitude of a differential voltage 239 ranges from a maximum of a differential voltage maximum level 240 ($V_H$) to a minimum of a differential voltage minimum level 245 ($V_L$). The positive component 210 of a complementary differential voltage pair is applied, for example, to the positive differential input 110 of the front-end voltage level shifter 100 and the negative component 250 of a complementary differential voltage pair is applied to the negative differential input 150 as detailed supra.

However, independent operational amplifiers, like the four required in FIG. 1, mean that individual and independent offset factors may be introduced and that a significant number of devices are required to implement the four circuits. This approach requires increased area on the integrated circuit and power that are expensive to implement. Additionally, so many independent devices are unwieldy for maintaining close tracking tolerances in the output voltages.

Therefore, what is needed is: a design providing a means of regulating the shift voltage of the front-end voltage shifter with close tracking amongst the voltages produced; avoidance of multiple independent voltage offset constituents; and an implementation of a voltage detector with fewer devices. It is additionally desirable to produce a design of a front-end shifter that does not require a network of active devices with their ensuing voltage threshold requirements. Such active devices are unable to scale with an ever-lowering supply voltage.

DISCLOSURE OF INVENTION

The present invention is directed to an apparatus for detecting a differential voltage pair at a configurable threshold voltage. This is accomplished with a differential voltage pair as an input to a front-end voltage shifter, which in turn is coupled to an overlap voltage detector that produces an output signal indicating a detected signal. The front-end voltage shifter receives the differential voltage pair as input and provides a shifted version and an essentially equal non-shifted version that is in phase with the shifted version. This structuring of voltage pairs is suitable for application to a backend overlap detector, where an output signifies a detected signal at a configured voltage threshold.

A magnitude of current, within a current mirror circuit, generates a corresponding voltage reference output. A voltage following current generator connected with the voltage reference, produces an output current magnitude configured by the magnitude of current in the current mirror circuit. The current generator output is applied to a voltage shifting circuit.

Within the front-end voltage shifter, there is one voltage shifting circuit for each component of an input differential voltage pair. The voltage reference output is connected to each voltage shifting circuit generating an essentially equal calibrated current in each voltage shifting circuit. The voltage shifting circuit produces both the shifted version and the non-shifted version of the differential input voltage pair. The non-shifted version is produced in phase with the shifted version for comparison purposes. The shifted version and the non-shifted version are applied to the overlap voltage detector, described herein. A magnitude of current within the shifting circuit is selected to create a magnitude of voltage shift at the output terminals calibrated to be less than a desired peak-to-peak magnitude of a differential input voltage to be detected. Both sets of differential voltages are calibrated due to the essentially equal currents flowing in each voltage shifting circuit. Four differential voltage components are produced.

These four differential voltage components are fed to the input terminals of a differential overlap detector. A network of devices driven by the differential voltage components provides intermediate differential voltage inputs to a differential amplifier. An output signal from the differential amplifier indicates detection of a differential signal at the configured threshold.

These and other features, aspects, and advantages of the present invention will become better understood with reference to the following description and appended claims.

BRIEF DESCRIPTION OF THE DRAWINGS

FIG. 1 shows a prior art circuit for producing a voltage shifted version and a version essentially equal and in phase, from an input complementary differential voltage pair.

FIG. 2 shows input voltage waveforms corresponding to the prior art circuit of FIG. 1.

FIG. 3 depicts a high-speed front-end differential voltage shifter of the present invention.

FIG. 4 shows voltage waveforms of the high-speed front-end differential voltage shifter of FIG. 3.

FIG. 6 shows voltage and current waveforms of the voltage overlap detector of FIG. 5.

FIG. 7 shows an exemplary process flow diagram for detecting differential voltages.

FIG. 8 shows an exemplary process flow diagram for shifting a differential voltage pair.

MODES FOR CARRYING OUT THE INVENTION

Figure 5:
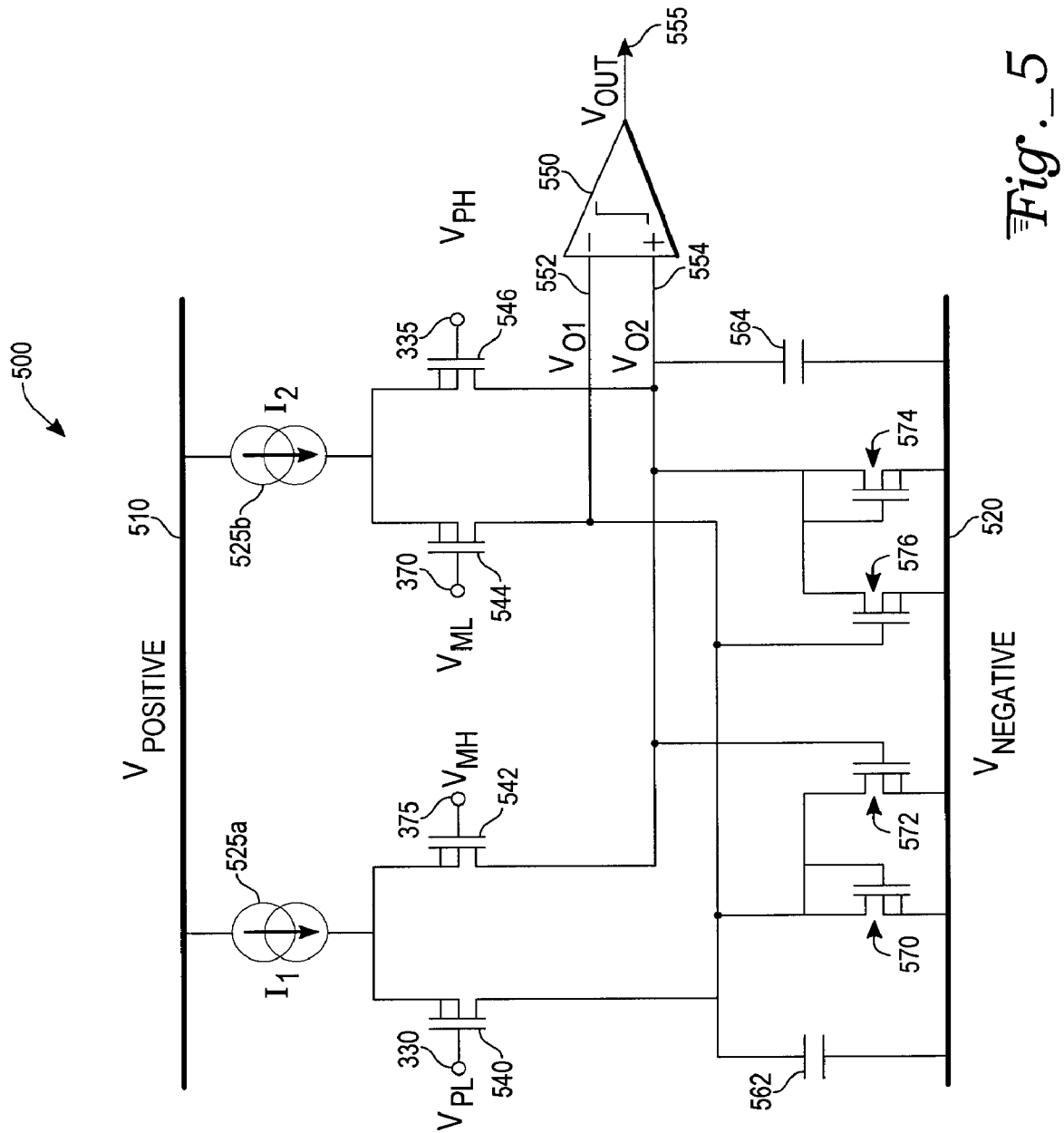
FIG. 5 shows a voltage overlap detector of the present invention.

With respect to FIG. 3, an exemplary embodiment of a front-end level shifter 300 includes a series coupling of a voltage generating PMOS transistor 355 and a current reference 360 between a positive power bus 305 and a negative power bus 320. The voltage generating PMOS transistor 355 and a current reference 360 form a current mirror producing a reference voltage at a voltage reference terminal 359.

A positive signal component of a complementary differential voltage pair is connected at a positive differential input 310 ($V_P$) of a first differential input PMOS transistor 312. The first differential input PMOS transistor is coupled with a source terminal to a positive differential—low terminal 330 ($V_{PL}$) and a drain terminal to the negative power bus 320. A first voltage shifting circuit 315 is coupled between the positive differential—low terminal 330 and a positive differential—high terminal 335 ($V_{PH}$). The first voltage shifting circuit 315 contains a parallel connection of a first voltage shifting resistor 314 and a first voltage shifting capacitor 316. A first current regulating PMOS transistor 318 is coupled between the positive differential—high terminal 335 and the positive power bus 305.

The voltage reference terminal 359 is coupled to a first voltage control input 319 supplying the reference voltage and producing a regulated current to the first voltage shifting circuit 315. A low level signal applied to the positive differential input 310 causes a low level at the positive differential—low terminal 330 allowing a regulated current passing through to produce a positive differential—low voltage 430 (FIG. 4) at the positive differential—low terminal 330 and a positive differential—high voltage 435 at the positive differential—high terminal 335. The magnitude of the positive differential—high voltage 435 produced at the positive differential—high terminal 335 is proportional to a magnitude of the regulated current produced by the first current regulating PMOS transistor 318 passing through the first voltage shifting circuit 315. The magnitude of the current produced by the first current regulating PMOS transistor 318 is further configured to produce a shift of the positive differential—high voltage 435 that is less than a peak-to-peak voltage component of an input differential voltage pair to be detected.

The signal output at the positive differential—low terminal 330 compares to the signal input at the positive differential input 310 in magnitude, duration, pulse width, input and output slew rate, rise and fall times so as to be essentially equal to the signal at the positive differential input 310 and additionally, has a phase shift or delay equal to that of the positive differential—high terminal 335. This phase shift provides for the production of a delayed version, at the positive differential—low terminal 330, of the signal input at the positive differential input 310 and a shifted version, at the positive differential—high terminal 335, of the signal input at the positive differential input 310 that are in phase.

A negative signal component of a complementary differential voltage pair is connected to a negative differential input 350. The negative differential input 350 connects to circuitry that is symmetrical with the circuitry, described supra, for the positive differential input 310. The negative signal component produces results similar to the positive signal component, but shifted in phase by 180°. For instance, a negative differential—high voltage 475 is produced at a negative differential—high terminal 375 and a negative differential—low voltage 470 is produced at a negative differential—low terminal 370.

A specific exemplary embodiment of the present invention for application with a USB, for example, may have the voltage shifting resistors chosen appropriately to shift the magnitude of the input voltage pair to produce an overlap of between about 15 mV and 15 mV plus any offset voltage of the front-end level shifter 300. A value of capacitance connected in parallel with the voltage shifting resistors, would be chosen to have an RC time constant correlate with the maximum time period detected at the input. This time period occurs at a minimum input frequency.

With respect to FIG. 5, an exemplary embodiment of an overlap detector 500 includes a positive power bus 510 coupled to an input terminal of a first current source 525a and a second current source 525b. Each of the current sources 525a, 525b has an output terminal coupled to a source input of a pair of PMOS transistors 540, 542 and 544, 546. A first pull-up PMOS transistor 540 is coupled at a gate input to the positive differential—low terminal 330 (FIG. 3) of the front-end voltage level shifter 300 to receive a positive differential—low voltage 430 (FIG. 4). A second pull-up PMOS transistor 542 is coupled at a gate input to the negative differential—high terminal 375 of the front-end voltage level shifter 300 to receive a negative differential—high voltage 475. A third pull-up PMOS transistor 544 is coupled at a gate input to the negative differential—low terminal 370 of the front-end voltage level shifter 300 to receive a negative differential—low voltage 470. A fourth pull-up PMOS transistor 546 is coupled at a gate input to the positive differential—high terminal 335 of the front-end voltage level shifter 300 to receive a positive differential—high voltage 435.

A drain output of the first pull-up PMOS device 540 and the third pull-up PMOS device 544 are coupled to a negative input terminal 552 of a differential amplifier 550. The drain output of the second pull-up PMOS device 542 and the fourth pull-up PMOS device 546 are coupled to the positive input terminal 554 of the differential amplifier 550.

Two capacitors are coupled to the differential amplifier 550. A first capacitor 562 is coupled between the negative input terminal 552 of the differential amplifier 550 and a negative power bus 520. A second capacitor 564 is coupled between the positive input terminal 554 of the differential amplifier 550 and the negative power bus 520.

Each source terminal of two pairs of NMOS transistors 570, 572 and 574, 576 is connected to the negative power bus 520. A first pull-down NMOS transistor 570 is coupled by a gate input and a drain input to the negative input terminal 552 of the differential amplifier 550. A second pull-down NMOS transistor 572 has a gate input coupled to the positive input terminal 554 of the differential amplifier 550 and a drain input coupled to the negative input terminal 552 of the differential amplifier 550. A third pull-down NMOS transistor 574 is coupled by a gate input and a drain input to the positive input terminal 554 of the differential amplifier 550. A fourth pull-down NMOS transistor 576 has a gate input coupled to the negative input terminal 552 of the differential amplifier 550 and a drain input coupled to the positive input terminal 554 of the differential amplifier 550.

With respect to FIG. 6, exemplary overlap detection waveforms 600 represent interactions of a complementary differential voltage pair. A positive differential—low voltage 430 (FIG. 4) is produced at the positive differential—low terminal 330 (FIG. 3), a negative differential—low voltage 470 is produced at the negative differential—low terminal 370, a positive differential—high voltage 435 is produced at the positive differential—high terminal 335, and the negative differential—high voltage 475 is produced at the negative differential—high terminal 375, also detailed supra. All four of the differential voltage components are applied to the respective terminals of the overlap detector 500 (FIG. 5).

The negative differential—high voltage 475 overlap 420 with the positive differential—low voltage 430 or the positive differential—high voltage 435 overlap 425 with the negative differential—low voltage 470 produces a high-level positive differential network current 614 ($I_{O2}$). The positive differential network current 614 produces a high level of positive differential amplifier input voltage 654 ($V_{O2}$) to the positive differential amplifier input 554. The high level of positive differential amplifier input voltage 654 is applied to the second pull-down NMOS device 572 inducing a reverse negative differential network current 612 ($I_{O1}$) diminishing the voltage across the first pull-down NMOS device 570 which lowers the potential of the negative differential amplifier input voltage 652 ($V_{O1}$) being applied to the negative differential amplifier input 552.

This complementary set of voltages produces a high level of differential amplifier output voltage 655 ($V_{OUT}$) at the differential amplifier output terminal 555 during either overlapping phase. The high level of differential amplifier output voltage continues as long as succeeding overlaps are generated by a set of appropriate characteristics of an input complementary differential voltage pair.

With respect to practice of the present invention with a USB, a value for capacitors of at least approximately 140 femtoFarads and up to a value of capacitance that assures the rise in voltage of $V_{O1}$ does not exceed 10 mV and that $I_1$ is approximately 200 µA, is needed for signals with rise times of approximately 500 picoseconds.

With respect to FIG. 7, a method of detection 700 of differential voltages includes a selection 710 of a magnitude of voltage detection threshold chosen so that it is less than an expected peak-to-peak voltage of an input differential voltage pair. The threshold is chosen to be less than the input signal so that there will be an overlap that can be detected by overlap detector circuitry, described supra. The magnitude of the detection threshold is less than the input signal magnitude by an amount equal to the sum of any peak-to-peak noise component in the input signal and the magnitude of any nonlinearities of the voltage shifter circuit.

An input differential voltage pair is shifted 720 in potential by the selected voltage detection threshold, thereby producing a shifted version of the input voltage pair. Any portion of an input signal stream that is greater in magnitude than the detection threshold will produce an overlap with the non-shifted version. The process then detects 730 any overlap within each phase of a non-shifted version of the input differential voltage pair with each phase of the shifted version of the input differential voltage pair. A final step of the detection process produces 740 an output signal indicating whether the input differential voltage pair is detected at or above the selected detection threshold.

With respect to FIG. 8, a method 800 of creating a differential voltage pair shifted by a magnitude of shift potential includes a selection 810 of a magnitude of shift potential. The shift potential magnitude is selected to be less than an expected peak-to-peak signal so that the shifted output will overlap a non-shifted version. This overlap is a characteristic of the output signal that makes it suitable for detection. A magnitude of an electronic current reference is selected 820, which will electrically bias internal components of a differential voltage shifter, thereby producing a shift in potential of any input signals. The magnitude of electronic current will produce an internal bias point that produces a proportionate voltage shift. The process then shifts 830 the input differential voltage pair by a magnitude equal to the shift potential determined by the selected current reference to produce a shifted version of the input voltage pair. A final step of the shifting process produces 840 a shifted version and a non-shifted version of the input voltage pair as outputs.

Although the present invention has been described in terms of exemplary embodiments, one skilled in the art recognizes that additional embodiments could readily be conceived which are still within a scope of the present invention. For example, particular differential input voltage receiving means or switching means are presented as being PMOS or NMOS transistors, certain current regulation means are offered as being voltage following current generating PMOS devices, particular reference voltage generators are represented as being saturated PMOS load devices with gate connected to output, voltage regulation means delineated as being current mirrors, and voltage level shifting means depicted as being parallel couplings of resistors and capacitors wherein all are presented as exemplary embodiments for implementing the present invention. However, a skilled artisan could readily implement different approaches to, for example, the switching means by using Bipolar Junction Transistors, Junction Field Effect Transistors, or Insulated Gate Bipolar Transistors and accomplish the same voltage controlling means. A skilled artisan might employ alternative reference voltage generators and/or voltage regulation means from such embodiments as a series combination of load devices between appropriate voltage busses composed of enhancement mode or depletion mode configurations of NMOS or PMOS transistors or reverse biased zener diodes, and achieve the same voltage reference generation result. One skilled in the art might, alternatively, implement voltage level shifting means by composing resistive elements from non-saturated NMOS load devices with a gate coupled to a drain and construct electrical charge storage means as an arrangement of a MOS transistor device with a gate input as a first terminal and a source and a drain coupled to form a second terminal. By coupling these in a parallel, the same means for shifting potential between two terminals is achieved. Therefore, the scope of the present invention shall only be limited by the appended claims.

What is claimed is:

1. A differential voltage overlap detector comprising:
a pair of differential input voltage receiving means, each pair of receiving means configured for accepting a pair of differential voltage components;
a pair of current steering means, each pair of steering means being capable of producing said internal differential voltage component complementary to the other;
a pair of electrical current sources, each current source being configured to couple between a positive voltage supply and an input of one of said pair of current steering means, said electrical current sources being further configured to supply sufficient current to sustain an internal differential voltage at a node of one of said differential voltage components;
a differential amplification means for generation of an output detection signal from each of said internal differential voltage components of said pair of current steering means; and
a pair of electrical charge storage means, each storage means capable of a retention of an integrated electrical potential to an input of said differential amplifier, wherein the pair of electrical charge storage means is respectively coupled in parallel with the pair of current steering means.

2. The differential voltage overlap detector of claim 1, wherein each of said differential input voltage receiving means comprises a pair of input terminals, each of said input terminals being configured to receive a single component of either a shifted or a non-shifted complementary component of an input differential voltage pair.

3. The differential voltage overlap detector of claim 2, wherein said input terminals each comprises a switching means, wherein said switching means is a p-type metal oxide semiconductor field effect transistor.

4. The differential voltage overlap detector of claim 1, wherein said current steering means further comprises a switching means and a resistive loading means, said switching means being coupled in parallel with said resistive loading means.

5. The differential voltage overlap detector of claim 4, wherein said switching means is configured to shunt a current flow through said resistive loading means by coupling an output of said resistive loading means to a negative power reference.

6. The differential voltage overlap detector of claim 4, wherein said switching means is further configured to receive a controlling input from an output of a complementary instance of one of said differential input voltage receiving means.

7. The differential voltage overlap detector of claim 4, wherein said switching means is an n-type metal oxide semiconductor field effect transistor.

8. The differential voltage overlap detector of claim 4, wherein said resistive loading means is an n-type metal oxide semiconductor field effect transistor configured as a saturation mode load device with a gate coupled to a drain output.

9. The differential voltage overlap detector of claim 1, wherein said differential amplification means is a differential amplifier.

10. The differential voltage overlap detector of claim 1, wherein said electrical charge storage means is a capacitor.

11. A differential voltage overlap detector comprising:
a pair of differential voltage inputs, each pair of inputs having a pair of input terminals configured to receive a component of a complementary input voltage, said component of a complementary input voltage being further configured to be a shifted or a non-shifted constituent of a differential voltage pair;
a pair of current steering networks, each pair of current steering networks configured to receive one of said differential voltage inputs and produce one of a pair of internal differential voltages;
a pair of electrical current sources, each current source being configured to couple between a positive voltage supply and an input of one of said current steering networks, said electrical current sources being further configured to supply sufficient current to sustain an internal differential voltage at a node of one of said internal differential voltages;

a differential amplifier configured to output a detection signal derived from a pair of said internal differential voltages; and a pair of electrical charge storage devices, each storage device being configured to retain a sufficient charge to produce a sustaining voltage at one of said internal differential voltage nodes, wherein the pair of electrical charge storage devices is respectively coupled in parallel with the pair of current steering networks.

12. The differential voltage overlap detector of claim 11, wherein said pair of input terminals of one of said differential voltage inputs each comprises a switching device, wherein said switching device having a first controlling input coupled to said single component of said complementary differential voltage, an output coupled to an input of one of said current steering networks, and a second input coupled to one of said electrical current sources.

13. The differential voltage overlap detector of claim 12, wherein said switching device is a p-type metal oxide semiconductor field effect transistor.

14. The differential voltage overlap detector of claim 11, wherein said current steering network further comprises a switching device and a resistive loading device, said switching device is coupled in parallel with said resistive loading device.

15. The differential voltage overlap detector of claim 14, wherein said switching device is configured to shunt a current flow through said resistive loading device by coupling an output of said resistive loading device to a negative power reference.

16. The differential voltage overlap detector of claim 14, wherein said switching device is further configured to receive a controlling input from an output of a complementary instance of said input terminals of one of said differential voltage inputs.

17. The differential voltage overlap detector of claim 14, wherein said switching device is an n-type metal oxide semiconductor field effect transistor.

18. The differential voltage overlap detector of claim 14, wherein said resistive loading device is an n-type metal oxide semiconductor field effect transistor configured as a saturation mode load device with a gate coupled to a drain output.

19. The differential voltage overlap detector of claim 11, wherein said electrical charge storage device is a capacitor.

20. A method of detecting differential voltages, the method comprising:

selecting a magnitude of a voltage detection threshold less than a peak-to-peak voltage of an input differential voltage pair;

shifting a potential of said input differential voltage pair by said magnitude of said voltage detection threshold to produce a shifted version of said input differential voltage pair;

detecting an overlap of each phase of said non-shifted version with each phase of said shifted version of said input differential voltage pair; and producing an output signal indicating whether said input differential voltage pair is detected at or above said selected magnitude of said voltage detection threshold, wherein a pair of electrical charge storage devices is used to respectively retain sufficient charges to produce sustaining voltages at said input differential voltage pair, wherein said magnitude of said voltage detection threshold is selected to be equal to said peak-to-peak voltage of said input differential voltage pair minus a peak-to-peak magnitude of a noise component of said input voltage pair.

21. The method of detecting differential voltages of claim 20, wherein said magnitude of said voltage detection threshold is less than a peak-to-peak voltage of a Universal Serial Bus signal by at least about 15 millivolts and up to about 15 millivolts plus any voltage offsets in the shifting process.

22. The method of detecting differential voltages of claim 20, wherein said non-shifted version is in phase with said shifted version.

* * * * *